United States Patent
Teter

[19]

[11] Patent Number: 6,063,152
[45] Date of Patent: May 16, 2000

[54] TUNED ELECTROMAGNETIC INTERFERENCE AIR FILTER

[75] Inventor: John M. Teter, Brown Deer, Wis.

[73] Assignee: Marconi Communications Inc., Cleveland, Ohio

[21] Appl. No.: 09/025,138

[22] Filed: Feb. 17, 1998

Related U.S. Application Data

[60] Provisional application No. 60/038,632, Feb. 19, 1997.

[51] Int. Cl.[7] ........................................................ B32B 5/14
[52] U.S. Cl. .................... 55/385.1; 55/385.7; 428/307.7; 428/308.4; 428/422
[58] Field of Search .................................... 55/327, 385.1, 55/385.6, 385.7, 413; 361/801, 724, 816; 264/40.3; 428/307.7, 308.4, 422, 304.4

[56] References Cited

U.S. PATENT DOCUMENTS

| | | | |
|---|---|---|---|
| 5,506,047 | 4/1996 | Hedrick et al. | 428/307.7 |
| 5,641,438 | 6/1997 | Bunyan et al. | 264/40.3 |
| 5,796,593 | 8/1998 | Mills et al. | 361/801 |
| 5,798,485 | 8/1998 | Rohde et al. | 361/724 |
| 5,825,634 | 10/1998 | Moorehead, Jr. | 361/816 |

OTHER PUBLICATIONS

"Design Guide to the Selection and Application of EMI Shielding Materials", Copyright 1982, Sections 1–3, TECK-NIT, EMI Shielding Products, Cranford New Jersey.

*Primary Examiner*—David A. Simmons
*Assistant Examiner*—Minh-Chau T. Pham
*Attorney, Agent, or Firm*—Jones, Day, Reavis & Pogue

[57] ABSTRACT

A novel air filter is provided for a vented area for minimizing or limiting electromagnetic interference (EMI) leakage and for providing ventilation, by allowing the egress of gases out of the vented area, and air filtration, by preventing or deterring the ingress of undesirable environmental conditions into the vented area. Such a vented area may be cabinet having a plurality of walls which houses electronic systems or subsystems. The air filter includes a dimple provided in the surrounding surface of the vented area. The dimple has a ventilating port provided therethrough. The air filter further includes a non-woven material covering the ventilating port. The non-woven material allows the passage of gases therethrough and substantially prevents the passage of liquid therethrough. The size of the ventilating port determines the amount of EMI leakage allowed through the air filter. The non-woven material is preferably adhesively attached to the surrounding surface.

5 Claims, 1 Drawing Sheet

TUNED ELECTROMAGNETIC INTERFERENCE AIR FILTER

CROSS-REFERENCE

This patent application claims the priority of provisional application Ser. No. 60/038,632, filed on Feb. 19, 1997 and entitled "Tuned Electromagnetic Interference Air Filter".

BACKGROUND

The present invention relates to a novel air filter for use with a system which emits electromagnetic interference (EMI).

Ventilating ports are often required on devices or systems which emit EMI. For example, in an electronics equipment cabinet, ventilating ports are required to provide heat transferring air circulation. While it is important to maintain the ventilation to achieve a desired equipment temperature condition, such ventilation ports often also provide a path for emitting EMI. Various regulations set limits on EMI which can be emitted from any particular system, subsystem or device. As such, there is a need for a ventilation port which limits EMI emissions.

Another problem that arises with ventilating ports is that such ports provide a path for the ingress of water, moisture, humidity, as well as particulate material and other undesirable environmental factors. As such, it is also be desirable to provide a filter which prevents the ingress of undesirable environmental conditions while simultaneously limiting EMI emissions.

The present invention presents a novel air filter which achieves this need and this desire. Other features and advantages will become apparent upon a reading of the attached specification in combination with a study of the drawings.

OBJECTS AND SUMMARY

A general object of the present invention is to provide a novel air filter which maximizes the shielding effectiveness of a vented area.

An object of the present invention is to provide a novel air filter limits or minimizes EMI emissions.

Another object of the present invention is to provide a novel air filter for a device or system which prevents the ingress of undesirable environmental conditions and provides air filtration and ventilation.

Briefly, and in accordance with the foregoing, the present invention discloses a novel air filter for a vented area which is used to minimize or limit electromagnetic interference (EMI) leakage and to provide ventilation, by allowing the egress of gases out of the vented area, and to provide air filtration, by preventing or deterring the ingress of undesirable environmental conditions into the vented area. Such a vented area may be cabinet having a plurality of walls which houses electronic systems or subsystems.

The air filter includes a dimple provided in the surrounding surface of the vented area. The dimple has a ventilating port provided therethrough. The size of the ventilating port determines the amount of EMI leakage allowed through the air filter. The air filter further includes a non-woven material covering the ventilating port. The non-woven material allows the passage of gases therethrough and substantially prevents the passage of liquid therethrough. The non-woven material is preferably adhesively attached to the surrounding surface.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
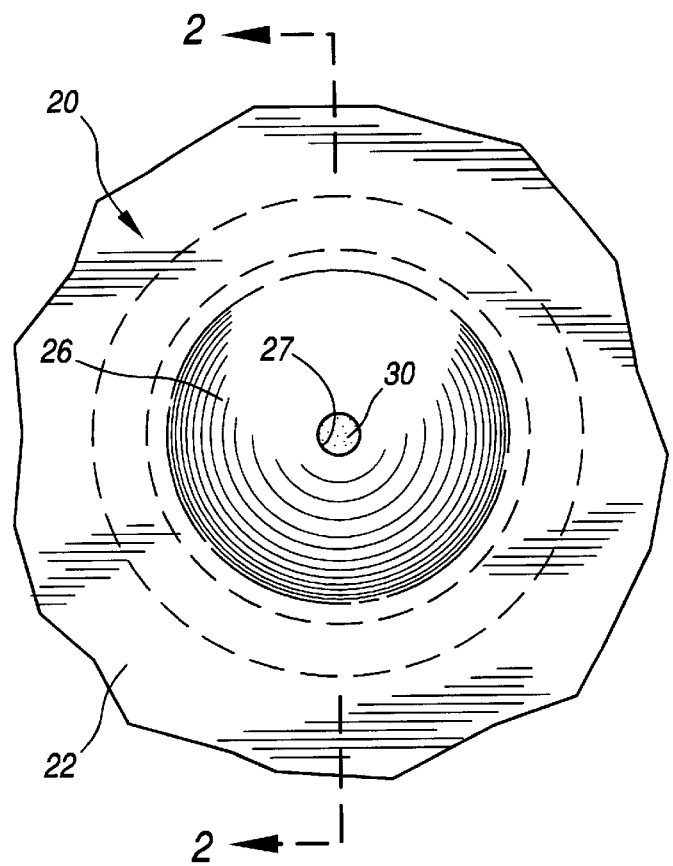
FIG. 1 is an enlarged, partial fragmentary, elevational view of a preferred embodiment of a tuned EMI air filter which incorporates features of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
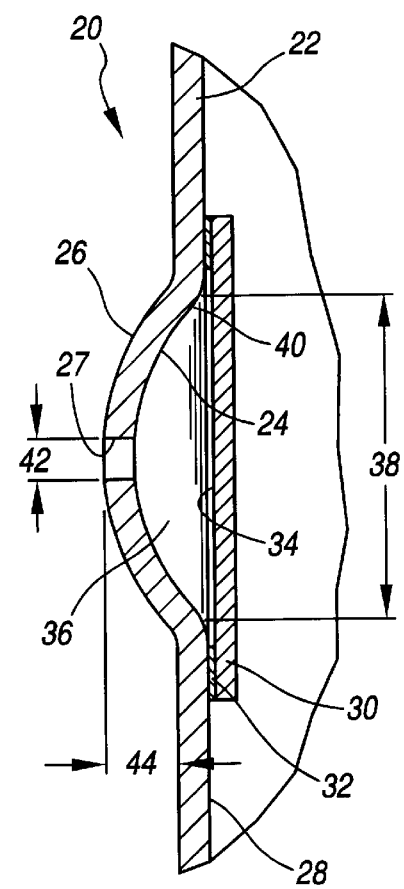
FIG. 2 is a cross-sectional view along line 2—2 in FIG. 1.
Figure 3:
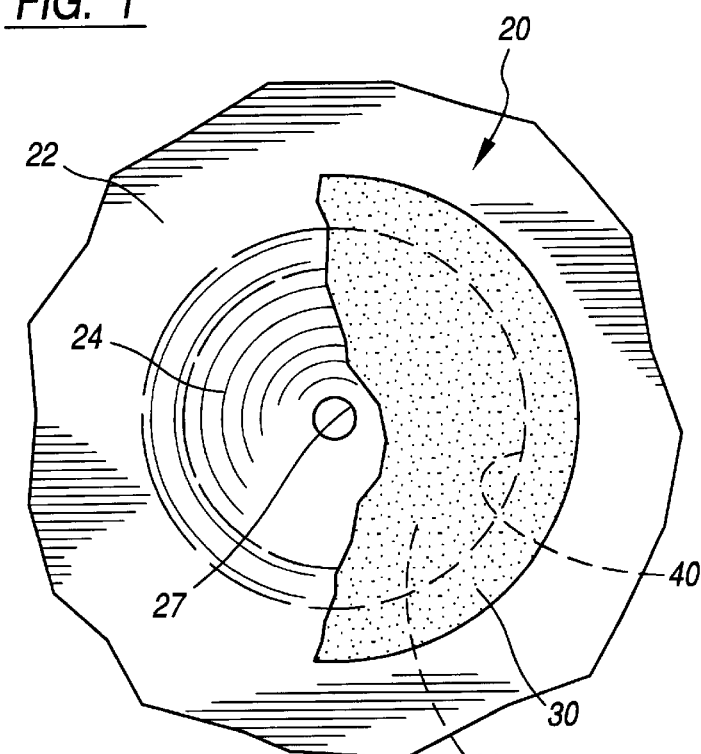
FIG. 3 is a partial fragmentary, rear-elevational view of the tuned EMI air filter shown in FIGS. 1 and 2 showing the positioning of a filter material over a dimple in a surrounding surface of a vented area.

With reference to FIGS. 1–3, the present invention is a novel air filter element 20 for use in a vented area which maximizes the shielding effectiveness of a vented area. The air filter 20 of the present invention achieves two generally opposing objectives. A first objective is to minimize or limit the electromagnetic interference EMI leakage, i.e. the amount of EMI which is emitted through the vented area, and a second objective being to provide ventilation by allowing the egress of gases out of the vented area and air filtration by preventing or deterring the ingress of undesirable environmental conditions into the vented area. Such a vented area may be cabinet having a plurality of walls which houses electronic systems or subsystems.

The air filter 20 of the present invention is provided on a wall or surrounding surface 22 of the vented area by forming a dimple such as a concave or recessed area 24 in the material of the surrounding surface 22. The dimple 24 results in a corresponding convex protuberance 26 on the outside surface of the surrounding surface 22. A "tuned hole" or ventilating port 27 is provided through the dimple 24. It is anticipated that many different shapes may be used for the dimple 24 in that the invention disclosed herein is not limited to a generally radially symmetric arcuate dimple as shown in FIGS. 1–3. The generally radially symmetric arcuate shape of the dimple 24 shown in the drawings is easy to tool. The radially symmetric dimple 24 is shown in the drawings is provided as a generic form of the preferred embodiment of the present invention.

An inside surface 28 of the surrounding surface 22 provides a mounting surface for a fabric patch 30. The fabric patch 30 is attached to the inside surface 28 of the surrounding surface 22 by means of an adhesive material 32 conveniently applied to a face surface 34 of the fabric patch 30. As shown in the drawings, the dimensions of the fabric patch 30 thickness, as well as the thickness of the adhesive material 32, are exaggerated for purposes of illustration and clarity. A chamber 36 is defined between the face surface 34 of the fabric patch 30 and the dimple 24. Alternatively, the fabric patch 30 can be adhesively secured to the inner wall of the dimple 24.

In a preferred embodiment of the present invention, the fabric patch 30 is provided in the form of a non-woven fabric, such as GORE-TEX®, formed of expanded polytetraflouroethylene (PTFE) material. A specific type of material might be ZINTEX™ oleophobic laminate having a 0.45 micron pore size on non-woven polyester. These types of materials provide for a plurality of "open areas" through which smaller molecules can pass, such as gas molecules to allow gases to be vented therethrough, while preventing the passage of larger molecules therethrough, such as liquid molecules to prevent passage of liquid therethrough.

The adhesive material 32 is a compatible adhesive which is placed in an annular area radially spaced from the center of the fabric patch 30. Use of adhesive provides uncomplicated attachment of the fabric patch 30 to the surrounding surface 28.

The difference in the diameter 38 of a mouth 40, such mouth 40 being defined by the surface area of the fabric patch 30 which is within the wall of the dimple 24, and a diameter 42 of the ventilating port 27 maximizes the effective surface area of the filtration effect provided by the fabric patch 30. When the surface areas of the open areas of the fabric patch 30 are combined, the total surface area of the open areas approximately equal the surface area of the ventilating port 27 to prevent any pressure differentials within the chamber 36.

The diameter 42 of the ventilating port 27 minimizes the amount of EMI leaking out of the vented area. The size of the ventilating port 27 controls the amount of EMI which is emitted from the vented area and the ventilating port 27 can be sized to minimize or limit the EMI leakage. As the port 27 is decreased in size, the more frequencies can be filtered. However, as the port 27 is decreased in size, the less air flow is provided through the port 27 for ventilation of the vented area.

Specific calculations can be carried out to determine the most desired size for the filter 20, a desired size for an offset 44 by which the protuberance 26 extends away from the surrounding surface 22, the size of the "tuned hole" or ventilating port 27, and the required area of the fabric patch 30 overlying the dimple 24 to achieve a desired filtering characteristic for a specific set of constraints and/or parameters. The sizing of the open area of the filter material 30 relative to the open area 42 requires the balance to achieve the desired ventilation and EMI shielding effectiveness. As mentioned above, the material 30 has a number of openings which allow ventilation therethrough. The cumulative area of these openings in the material 30 must at least equal the diameter 42 of the opening. Once the ventilation requirements are determined for the electronics equipment cabinet and the permitted EMI loss, shielding effectiveness, is determined for the particular equipment, calculations can be carried out to determine the most desired size for the filter, the offset and the ventilating port 27.

Details of some of these calculations can be found in the "Design Guide to the Selection and Application of EMI Shielding Materials", Copyright 1982, TECKNIT, EMI Shielding Products, Cranford, N.J., which Design Guide is incorporated herein by reference. A plurality of filters 20 can be produced on a portion of material forming the surrounding surface 22. A punch device of known construction can be used to form both the dimple 24 and the ventilating port 27. A plurality of dimples 24 and ventilating ports 27 can be simultaneously punched or punched in a desired pattern. Instead of individual fabric patches 30 covering individual dimples 24 in a grouping or cluster, a field of fabric material made of the same material as fabric patch 30 can be applied over a grouping or cluster of dimples 24 to achieve the same characteristics. An adhesive material, like adhesive material 32, may be applied directly to the field of fabric material or may be applied to the inside surface 28 of the body 22. Alternatively, a reinforcing material, such as might be formed of a honeycomb structural piece (details regarding the honeycomb structure are provided on page 3–4 of the TECKNIT Design Guide), for example an aluminum screen, could also be applied to the inside surface 28 of the body to retain the fabric 30 therebetween.

While a preferred embodiment of the present invention is shown and described, it is envisioned that those skilled in the art may devise various modifications of the present invention without departing from the spirit and scope of the appended claims.

The invention claimed is:

1. A combination air and EMI filter for a vented area having a surrounding surface, said combination air filter and EMI filter comprising: a portion of the surrounding surface defining a dimple, said dimple having a surface which is offset from the remainder of the surrounding surface and having a ventilating port provided therethrough, said ventilating port having a dimension which is sized to minimize the amount of EMI leakage from the vented area; and a non-woven material covering at least a portion of said dimple and covering said ventilating port, said non-woven material allowing the passage of gases through said ventilating port and substantially preventing the passage of liquid and particulate through at least a portion of said dimple and through said ventilating port, the surface area of said non-woven material which covers at least a portion of said dimple and covers said ventilating port defining a dimension which is different than said dimension of said ventilating port for maximizing the effective surface area of the filtration provided by said non-woven material.

2. A combination air and EMI filter as defined in claim 1, wherein said non-woven material is attached to the surrounding surface.

3. A combination air and EMI filter as defined in claim 2, wherein said non-woven material is attached to the surrounding surface by adhesive.

4. A combination air and EMI filter as defined in claim 1, wherein said non-woven material is expanded polytetraflouroethylene material.

5. A combination air and EMI filter as defined in claim 1, wherein said non-woven material has a plurality of open areas therethrough to allow the passage of gases therethrough and to substantially prevent the passage of liquid and particulate therethrough, wherein the total surface area of the open areas approximately equals the surface area of said ventilating port.

* * * * *